(12) United States Patent
Mitani et al.

(10) Patent No.: US 9,634,688 B2
(45) Date of Patent: Apr. 25, 2017

(54) INTEGRATOR, DELTA-SIGMA MODULATOR, AND COMMUNICATIONS DEVICE

(71) Applicant: SOCIONEXT INC., Kanagawa (JP)

(72) Inventors: Yosuke Mitani, Tokyo (JP); Takashi Morie, Osaka (JP); Kazuo Matsukawa, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 15/194,420

(22) Filed: Jun. 27, 2016

(65) Prior Publication Data
US 2016/0308553 A1    Oct. 20, 2016

Related U.S. Application Data

(63) Continuation of application No. PCT/JP2014/006322, filed on Dec. 18, 2014.

(30) Foreign Application Priority Data

Dec. 27, 2013 (JP) ................. 2013-271164

(51) Int. Cl.
*H03M 3/00* (2006.01)
*H04B 3/54* (2006.01)
*H04B 14/06* (2006.01)

(52) U.S. Cl.
CPC ............ *H03M 3/422* (2013.01); *H03M 3/458* (2013.01); *H03M 3/48* (2013.01); *H04B 3/542* (2013.01); *H04B 14/06* (2013.01)

(58) Field of Classification Search
CPC ...... H03M 3/422; H03M 3/458; H04B 14/06; H04B 3/542
(Continued)

(56) References Cited

U.S. PATENT DOCUMENTS 4,509,019 A    4/1985   Banu et al.
4,786,880 A   11/1988   Voorman
(Continued)

FOREIGN PATENT DOCUMENTS

JP    S60-500395 A    3/1985
JP    S63-136707 A    6/1988
(Continued)

OTHER PUBLICATIONS

H. Inose, Y. Yasuda, "A unity bit coding method by negative feedback", (USA), Proceedings of the IEEE, Nov. 1963, vol. 51 p. 15 24-1535.
(Continued)

*Primary Examiner* — Jean B Jeanglaude
(74) *Attorney, Agent, or Firm* — McDermott Will & Emery LLP

(57) ABSTRACT

An integrator including: a resistive element connected to an input terminal; an operational amplifier configured to receive, through the resistive element, an input signal that has been supplied to the input terminal; and a voltage regulator circuit connected to an intermediate node between the resistive element and the operational amplifier. The voltage regulator circuit has a first current source connected to the intermediate node, and a switch connected between the intermediate node and the first current source and selectively turning ON or OFF.

12 Claims, 12 Drawing Sheets

(58) Field of Classification Search
USPC .......... 341/143, 155; 327/318; 323/211, 280
See application file for complete search history.

(56) References Cited

U.S. PATENT DOCUMENTS

| | | | | |
|---|---|---|---|---|
| 4,912,423 | A * | 3/1990 | Milkovic | ................ H03F 1/303 330/255 |
| 4,972,436 | A * | 11/1990 | Halim | .................. H03M 3/348 341/143 |
| 5,994,966 | A | 11/1999 | Stikvoort | |
| 7,208,919 | B2 * | 4/2007 | May | ......................... G05F 1/56 323/211 |
| 7,554,474 | B2 | 6/2009 | Le Guillou | |
| 8,766,610 | B2 * | 7/2014 | Imura | .................... H03F 1/223 323/280 |
| 8,937,567 | B2 * | 1/2015 | Obata | ................ H03F 3/45076 341/143 |
| 2002/0105454 | A1 | 8/2002 | Nanba et al. | |
| 2004/0227546 | A1 | 11/2004 | Nanba et al. | |
| 2008/0258796 | A1 * | 10/2008 | Romani | ................ H03G 11/00 327/318 |
| 2008/0309535 | A1 | 12/2008 | Le Guillou | |
| 2013/0169460 | A1 * | 7/2013 | Obata | ................ H03F 3/45076 341/143 |
| 2014/0159930 | A1 * | 6/2014 | Ho | ......................... H03M 3/32 341/143 |

FOREIGN PATENT DOCUMENTS

| | | |
|---|---|---|
| JP | 2000-508868 A | 7/2000 |
| JP | 3214981 B2 | 10/2001 |
| JP | 4268770 B2 | 5/2009 |
| JP | 2009-530875 A | 8/2009 |
| WO | 2012/153371 A1 | 11/2012 |

OTHER PUBLICATIONS

F. Gerfers, Y. Manoli, "A design strategy for low-voltage low-power continuous-time A/D converters", Design, Automation and Test Conference and Exhibition 2001 in Europe, Proceedings, 2001, pp. 361-368.

International Search Report issued in corresponding International Patent Application No. PCT/JP2014/006322, mailed on Mar. 3, 2015; with English translation.

Written Opinion issued in corresponding International Patent Application No. PCT/JP2014/006322, mailed on Mar. 3, 2015; with partial English translation.

* cited by examiner

INTEGRATOR, DELTA-SIGMA MODULATOR, AND COMMUNICATIONS DEVICE

CROSS-REFERENCE TO RELATED APPLICATIONS

This is a continuation of International Application No. PCT/JP2014/006322 filed on Dec. 18, 2014, which claims priority to Japanese Patent Application No. 2013-271164 filed on Dec. 27, 2013. The entire disclosures of these applications are hereby incorporated by reference.

BACKGROUND

The present disclosure relates to an integrator and a delta-sigma modulator including such an integrator, and more particularly relates to a technique for improving the conversion precision.

In general, in order to increase a signal-to-noise ratio (hereinafter referred to as "SNR") indicating the conversion precision of a continuous-time delta-sigma modulator used as an analog-to-digital (A/D) converter, it is effective to increase the amplitude of an input signal to be input to the A/D converter (the delta-sigma modulator). The maximum amplitude (which is also called a full-scale amplitude or overload level) of input that can be entered into an A/D converter is determined by a voltage range within which an operational amplifier and/or quantizer forming part of the A/D converter is allowed to perform processing. Usually, such amplitude is restricted by a supply voltage. For example, if the amplitude of an input signal supplied to the A/D converter (the delta-sigma modulator) is set to be equal to or higher than that of a supply voltage, the output of an operational amplifier forming part of the delta-sigma modulator is saturated to cause, e.g., a significant distortion of the output signal of the A/D converter (the delta-sigma modulator) or an unwanted abnormal oscillation state, which is a problem.

SUMMARY

As described above, it is difficult to improve the precision of the A/D converter (the delta-sigma modulator) by increasing the amplitude of an input signal of the A/D converter. This is because the operational amplifier forming part of the delta-sigma modulator cannot process a signal, of which the voltage is out of the supply voltage range. This point will now be specifically described with reference to FIG. 10.

FIG. 10A shows how a typical integrator 810 is connected to a driver buffer 800 such as a driver amplifier or buffer amplifier for driving the integrator 810. The integrator 810 includes a resistive element 811, an operational amplifier 812, and a capacitive element 813. The resistive element 811 is connected to the output terminal of the driver buffer 800 via a node N80. The operational amplifier 812 receives an output signal of the driver buffer 800 through the resistive element 811. The capacitive element 813 is connected between the input and output terminals of the operational amplifier 812. The integrator 810 is provided for, e.g., an input section of a continuous-time delta-sigma modulator.

FIGS. 10B and 10C each show the voltage waveform (the signal waveform) of the node N80 in a case where the driver buffer 800 and the integrator 810 are each configured as a set of core transistors (which are also called "internal transistors"). As used herein, the "core transistor" refers to a transistor for use in, e.g., an internal circuit where, e.g., a high-speed operation is performed.

If the driver buffer 800 and the integrator 810 are each configured as a set of such core transistors, a signal may be passed within a range of a supply voltage VDD1 of the core transistor (hereinafter simply referred to as "supply voltage VDD1") to a ground voltage GND. Considering that transistors forming each circuit operate linearly, a signal is generally passed at a voltage falling within the range of a voltage Va1 lower than the supply voltage VDD1 to a voltage Va2 higher than the ground voltage GND, with, e.g., VDD1/2 regarded as a center voltage. That is to say, the full-scale amplitude of a signal that can be input to the delta-sigma modulator is determined by either the supply voltage VDD1 or the voltage range Va1-Va2.

If the output range of the driver buffer 800 is expanded in order to input a signal with large amplitude to the delta-sigma modulator, the supply voltage VDD1 restricts the amplitude of the output signal (the voltage waveform of the node N80) of the driver buffer 800, and a significantly distorted signal is input to the integrator 810, as shown in FIG. 10C. That is to say, although the amplitude of the input signal of the A/D converter (the delta-sigma modulator) has been increased, the SNR of the A/D converter rather falls.

Thus, let us consider a method for increasing the supply voltage of the driver buffer 800 and integrator 810 using, e.g., an input/output (I/O) transistor (which is also called an "external transistor") that has a higher breakdown voltage than the core transistor. FIG. 10D shows the voltage waveform (the signal waveform) of the node N80 and the waveform of the output signal OUT of the integrator 810 if the driver buffer 800 and the integrator 810 are each configured as a set of I/O transistors. The I/O transistor is a transistor for use in, e.g., an I/O circuit.

If the driver buffer 800 and the integrator 810 are each configured as a set of I/O transistors, a signal may be passed within a range of a ground voltage GND to a supply voltage VDD2 of the I/O transistors (hereinafter simply referred to as "supply voltage VDD2") higher than the supply voltage VDD1 (for example, a voltage range Vb1-Vb2 in FIG. 10D). Accordingly, in this case, the amplitude of the output signal of the driver buffer 800 may be increased. That is to say, the integrator 810 may process a signal with increased amplitude, thus leading to increasing the SNR. However, I/O transistors have a higher breakdown voltage than core transistors, but have a larger transistor size and parasitic capacitance than core transistors. Thus, I/O transistors are not effective to realize a high-speed operation. On top of that, core transistors are usually used to form a control circuit designed to make digital correction such as dispersion correction or error correction. Thus, a voltage level conversion circuit (a level shifter circuit) needs to be provided between the I/O transistor and the core transistor. Accordingly, such a method for increasing the supply voltage of the driver buffer 800 and the integrator 810 using the I/O transistors is disadvantages in terms of speed, power, and area.

Conventional techniques are disclosed in H. Inose and Y. Yasuda, "A unity bit coding method by negative feedback," (USA), Proceedings of the IEEE, November 1963, Vol. 51, pp. 1524-1535, and F. Gerfers and Y. Manoli, "A design strategy for low-voltage low-power continuous-time ΣΔ A/D converters," Design, Automation and Test Conference and Exhibition 2001 in Europe, Proceedings, 2001, pp. 361-368. According to these conventional techniques, the full-scale amplitude described above is determined by a supply voltage. Therefore, these techniques also have the same or similar problem as/to the technique described with reference to FIGS. 10A-10D.

Japanese Patent No. 3214981 discloses a conventional delta-sigma modulator including a variable gain amplifier configured to allow the amplitude of an input signal to be variable. However, such a variable gain amplifier is unable to increase the full-scale amplitude described above.

In view of the foregoing background, it is therefore an object of the present disclosure to provide an integrator capable of processing an input signal with large amplitude (for example, an input signal having a larger voltage value than the supply voltage of an integrator) even without raising the supply voltage of the integrator.

A first aspect of the present disclosure provides an integrator including: a resistive element connected to an input terminal; an operational amplifier configured to receive, through the resistive element, an input signal that has been supplied to the input terminal; and a voltage regulator circuit connected to an intermediate node between the resistive element and the operational amplifier. The voltage regulator circuit has a first current source connected to the intermediate node, and a switch connected between the intermediate node and the first current source and selectively turning ON or OFF.

A second aspect of the present disclosure provides a delta-sigma modulator including: the integrator of the first aspect; a quantizer configured to convert an output signal of the integrator into a digital signal; and a D/A converter configured to convert the digital signal into an analog signal and feed the analog signal back to the intermediate node of the integrator.

A third aspect of the present disclosure provides a communications device including the delta-sigma modulator of the second aspect.

According to the first aspect, even if, e.g., the center voltage of the input signal is significantly different from the voltage of an input section (a virtual ground point) of the operational amplifier, part of direct current flowing toward the operational amplifier from the resistive element flows into the voltage regulator circuit. Thus, this may reduce an influence produced on the integrator by the difference between the center voltage of the input signal and the voltage of the input section (the virtual ground point) of the operational amplifier. On the other hand, the integrator may calculate the integral of the variation caused in the amount of current by a change in the amplitude of the input signal. This thus provides an integrator capable of processing an input signal with large amplitude (for example, an input signal having a larger voltage value than the supply voltage of the integrator) without raising the supply voltage of the integrator. In other words, even if the integrator is configured as, e.g., a set of core transistors, the present disclosure may provide an integrator capable of receiving an input signal having a larger voltage value than the supply voltage of the core transistors.

Accordingly, if the integrator of the first aspect is applied to a delta-sigma modulator as in, e.g., the second aspect, the integrator of the first aspect may process an input signal with such large amplitude without raising the supply voltage of the integrator. As a result, a delta-sigma modulator with high precision may be provided. If the delta-sigma modulator of the second aspect is applied to a communications device as in, e.g., the third aspect, a communications device with high precision may be provided.

A fourth aspect of the present disclosure provides a delta-sigma modulator including: an analog filter including an integrator configured to receive, and calculate an integral of, a first input signal; an adder configured to add a second input signal with smaller amplitude than the first input signal to an output signal of the analog filter and output a first analog signal; a quantizer configured to convert the first analog signal into a digital signal; and a D/A converter configured to convert the digital signal into a second analog signal and feed the second analog signal back to the integrator. The integrator includes a resistive element configured to receive the first input signal at one terminal thereof, and an operational amplifier connected to the other terminal of the resistive element via an intermediate node. The D/A converter is configured to allow a current to flow into, and out of, the intermediate node of the integrator while performing the D/A conversion. A current value of the current allowed to flow into, and out of, the intermediate node includes an offset current to increase a voltage drop across the resistive element.

A fifth aspect of the present disclosure provides a wireless communications device including the delta-sigma modulator of the fourth aspect.

According to the fourth aspect, the first input signal is supplied to the analog filter, and the second input signal with smaller amplitude than the first input signal is supplied to the feedforward-connected adder. The adder adds the second input signal to the output signal of the analog filter together, and the quantizer converts the sum of the signals into a digital signal. With such a configuration, the analog filter may be supplied with an input signal, of which the amplitude is greater than maximum amplitude processible by the adder and the quantizer. That is to say, this may increase the amplitude of the input signal to be supplied to the delta-sigma modulator. Accordingly, the delta-sigma modulator of this aspect may process an input signal with larger amplitude (for example, an input signal having a larger voltage value than the supply voltage of the adder and the quantizer). As a result, a delta-sigma modulator with high precision may be provided.

Accordingly, if the delta-sigma modulator of the fourth aspect is applied to a wireless communications device as in, e.g., the fifth aspect, a communications device with high precision may be provided.

The present disclosure may provide an integrator capable of processing an input signal with large amplitude (for example, an input signal having a larger voltage value than the supply voltage of the integrator) even without raising the supply voltage of the integrator. For example, applying an integrator of the present disclosure to a delta-sigma modulator may improve the degree of the precision of the delta-sigma modulator.

DETAILED DESCRIPTION

Principle of Generation of Disagreement in Center Voltages

Figure 11A:
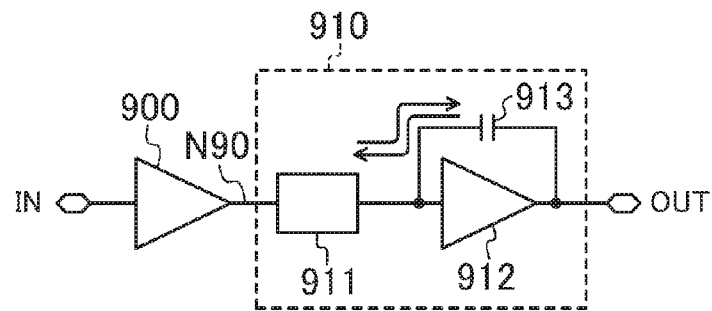
FIG. 11A conceptually illustrates an exemplary connection between a typical driver buffer and a typical integrator.

FIG. 11A shows how a typical integrator 910 configured as a set of core transistors may be connected to a driver buffer 900, such as a driver amplifier or buffer amplifier, configured as a set of I/O transistors for driving the integrator 910. As used herein, the core transistor refers to a transistor for use in, e.g., an internal circuit where, e.g., a high-speed operation is performed. A voltage of, e.g., 1.5 V is applied as a supply voltage VDD1. Also, the I/O transistor refers to a transistor for use in, e.g., an I/O circuit. A voltage of, e.g., 3.3 V is applied as a supply voltage VDD2.

The integrator 910 includes a resistive element 911, an operational amplifier 912, and a capacitive element 913. The resistive element 911 is connected to the output terminal of the driver buffer 900 via a node N90. The operational amplifier 912 receives an output signal of the driver buffer 900 through the resistive element 911. The capacitive element 913 is connected between the input and output terminals of the operational amplifier 912. The integrator 910 is provided for, e.g., an input section of a continuous-time delta-sigma modulator. Use of this configuration may increase the amplitude of an input signal to be supplied to the delta-sigma modulator (the integrator 910).

Figure 10A:
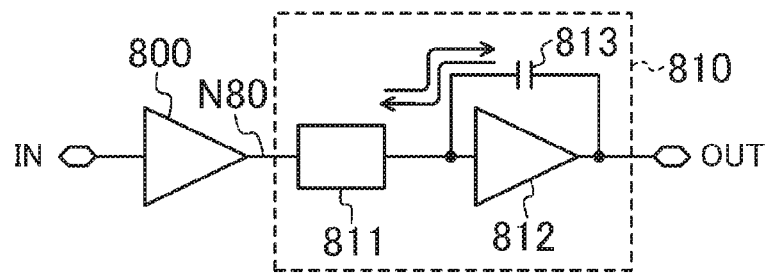
FIG. 10A conceptually illustrates an exemplary connection between a typical driver buffer and a typical integrator.
Figure 10B:
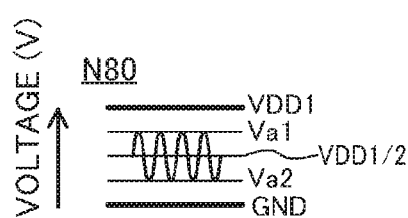
FIGS. 10B-10D illustrate exemplary waveforms.
Figure 10C:
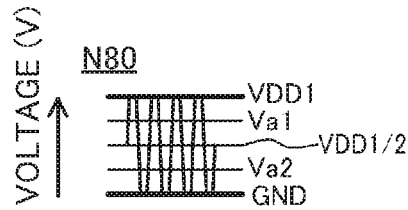
Figure 10D:
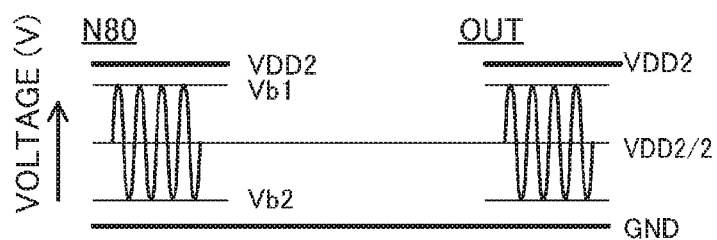
Figure 11B:
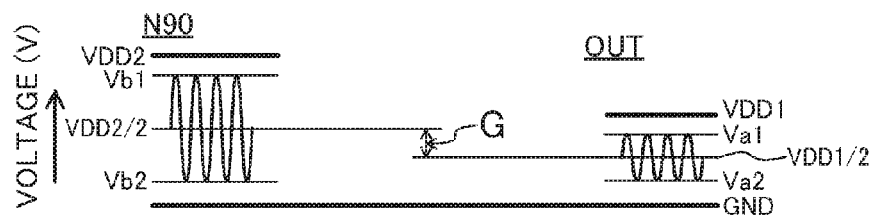
FIG. 11B shows the signal waveform of an intermediate node and the signal waveform of an output node in FIG. 11A.

FIG. 11B shows the voltage waveform (the signal waveform) of the node N90. As shown in FIG. 11B, even if the amplitude of an input signal to be supplied to the delta-sigma modulator (the integrator 910) is increased, the center voltage (VDD2/2) at the node N90 that is the output voltage of the driver buffer 900 does not agree with the center voltage (VDD1/2) at the output node OUT of the integrator 910 (as indicated by G in FIG. 11B). Thus, if, for example, the driver buffer 900 outputs a signal with a center voltage of VDD1/2, the signal cannot be passed from the driver buffer 900 to the integrator 910, which is a problem. To deal with such a problem, the center voltage of the output signal of the driver buffer 900, i.e., the center voltage at the node N90, may be adjusted to the center voltage (VDD1/2) at the output node OUT of the integrator 910, for example. However, according to this method, if the amplitude of the output signal of the driver buffer 900 is VDD1/2 or more, the output signal will have a distorted waveform where its potential is closer to the GND, as in FIG. 10C. Therefore, the output signal of the driver buffer 900 is restricted by the ground potential, thus making it impossible to increase the amplitude at the node N90. Thus, in order to increase the amplitude at the node N90, the center voltage of the output signal of the driver buffer 900 needs to be higher in this case than in a case where the driver buffer 900 is configured as a set of core transistors.

Figure 11C:
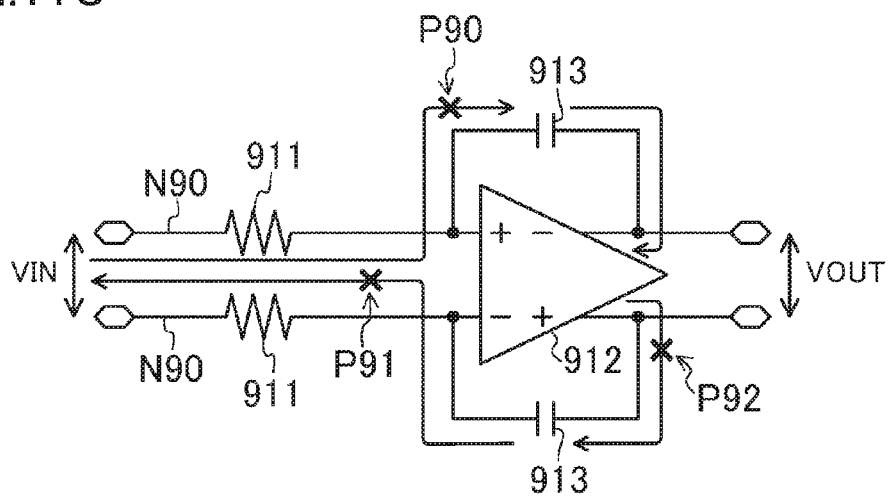
FIG. 11C illustrates an exemplary configuration for the integrator of FIG. 11A.

Suppose that the integrator 910 is operating with a center voltage of, e.g., VDD1/2. In such a situation, if the center voltage of the driver buffer 900 is raised as described above, the center voltage of an input signal VIN for the integrator 910, i.e., the center voltage (VDD2/2) at the node N90, is always higher than the center voltage (VDD1/2) of the core transistor. As a result, if a current is charged or discharged to or from the capacitive element 913 of the integrator 910 from or to the resistive element 911, the charge current and the discharge current are out of balance. Accordingly, the integrator 910 cannot perform the integration operation normally. Also, in some cases, no current may be charged or discharged to or from the capacitive element 913 of the integrator 910 from or to the resistive element 911. Specifically, if, for example, the center voltage of the input signal VIN of the integrator 910 is higher than the center voltage (VDD2/2) of the core transistors by a certain amount or more, in FIG. 11C, a current always flows toward the capacitive element 913 at a point P90, whereas no current flows through points P91 and P92. As a result, the integrator 910 cannot perform a charge or discharge operation. As can be seen, it is difficult to increase the amplitude of the input signal of the delta-sigma modulator by, e.g., only changing types of the transistors of the driver buffer 900 supplying the delta-sigma modulator with the input signal and thereby raising the supply voltage of the driver buffer.

For example, Japanese Patent No. 4268770 discloses a conventional level shifter circuit included in a semiconductor integrated circuit (a D/A conversion system). The center voltage of a signal yet to pass through the level shifter circuit is different from that of the signal that has passed through the level shifter circuit. Accordingly, this conventional circuit also has the same or similar problem to be solved as/to the above-described technique. Therefore, some countermeasures need to be taken.

Embodiments of the present disclosure will now be described in detail with reference to the accompanying drawings. Note that description of any element performing substantially the same function as its counterpart already described may be omitted herein to avoid redundancies.

First Embodiment

Integrator

Figure 1:
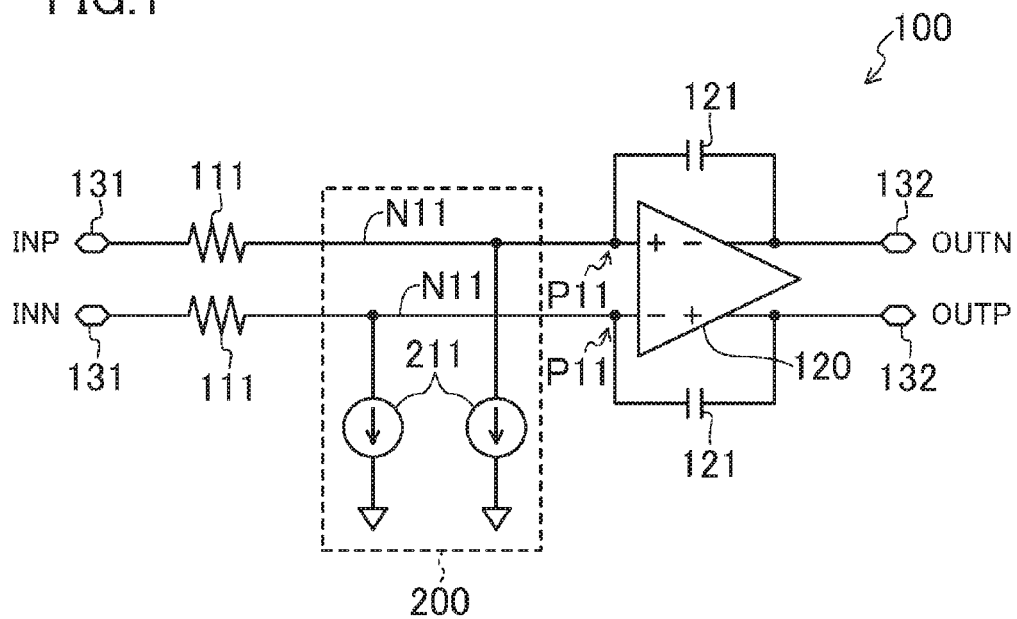
FIG. 1 conceptually illustrates an integrator according to a first embodiment.

FIG. 1 illustrates an exemplary configuration for an integrator according to this embodiment.

As illustrated in FIG. 1, an integrator 100 includes a differential pair of input terminals 131, a differential pair of resistive elements 111, an operational amplifier 120, a differential pair of capacitive elements 121, and a voltage regulator circuit 200. Each of the resistive elements 111 has one terminal thereof connected to an associated one of the input terminals 131. The operational amplifier 120 is connected to the other terminals of the resistive elements 111 via intermediate nodes N11. Each of the capacitive elements 121 is connected between associated input and output terminals of the operational amplifier 120. The voltage regulator circuit 200 is provided between the resistive elements 111 and the operational amplifier 120. The operational amplifier 120 receives a differential pair of input signals INP and INN from the differential pair of input terminals 131, and outputs a differential pair of output signals OUTN and OUTP, of which the polarities have each been inverted, to a differential pair of output terminals 132.

The voltage regulator circuit 200 includes a differential pair of current sources 211 connected between the intermediate nodes N11 and the ground, and each functioning as a first current source extracting a predetermined amount of current from an associated one of the intermediate nodes N11.

In FIG. 1, when the input signals INP and INN are received at the input terminals 131, a potential difference is produced between the input terminals 131 and virtual ground points P11 of the operational amplifier 120, and an electric charge q1 moves to allow a current to flow through the resistive elements 111. This electric charge q1 is charged into or discharged from the capacitive elements 121. On the other hand, the current sources 211 connected to the virtual ground points P11 and the resistive elements 111 through the intermediate nodes N11 each operate so as to extract a certain amount of current from an associated one of the intermediate nodes N11 toward itself. This operation of extracting a certain amount of current from the intermediate nodes N11 through the resistive elements 111 increases the magnitude of a voltage drop across the resistive elements 111. As a result, this may achieve substantially the same, or similar, advantage as/to when the level of the center voltage of each of the input signals INP and INN falls to a lower voltage level. This shifted voltage level is controllable by the current value of the current sources 211. Thus, even in a situation where a pair of signals having larger amplitude than the supply voltage of the core transistors is input through the input terminals 131, substantially the same, or similar, advantage may be achieved as/to when the level of the center voltage of each of the input signals INP and INN is shifted in accordance with the amplitude or center voltage of the signal. This may allow part of direct current that flows out of the resistive elements 111 due to a difference between the center voltage of each of the input signals INP and INN and the voltage at an associated one of the virtual ground points P11 to enter an associated one of the current sources 211 of the voltage regulator circuit 200, while allowing the integrator 100 to calculate the integral of a current if the amplitude of each of the input signals INP and INN changes.

As can be seen, according to this embodiment, the integrator 100 configured as a set of core transistors having a low breakdown voltage may receive a pair of signals having larger amplitude than the supply voltage of the core transistors, thus improving the SNR of the integrator 100 and eventually the SNR of a circuit including the integrator 100, such as a delta-sigma modulator.

Figure 2:
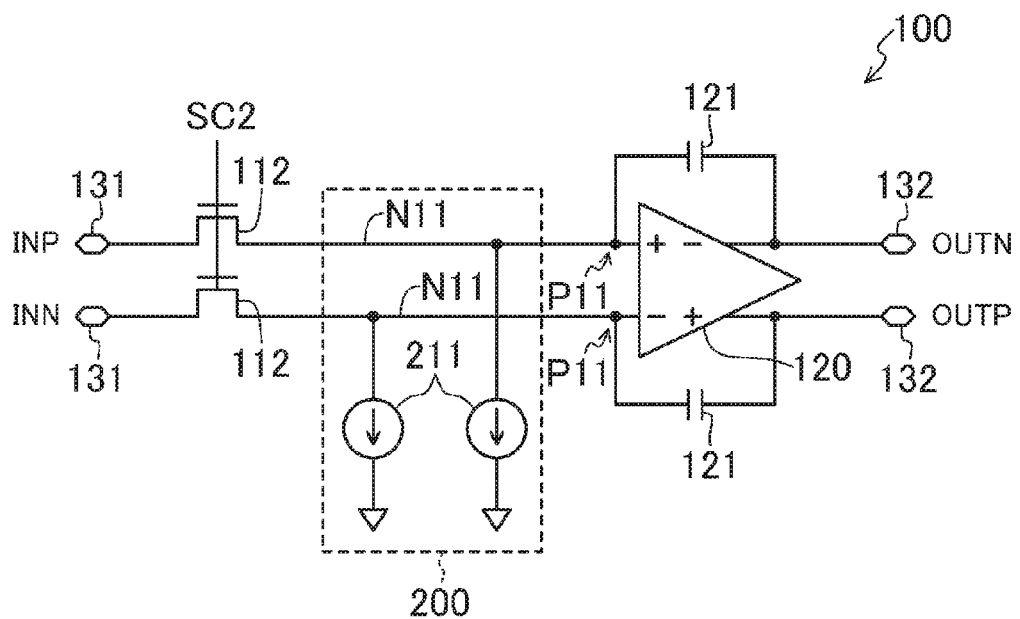
FIG. 2 illustrates an exemplary variation of the integrator.

As shown in FIG. 2, the resistive elements 111 may be replaced with metal oxide semiconductor (MOS) transistors 112 functioning as alternative differential pair of resistive elements. Specifically, the MOS transistors 112 are connected between the differential pair of input terminals 131 and the differential pair of input terminals of the operational amplifier 120. The gate of each of the MOS transistors 112 receives a control signal SC2 to control the ON-state resistance of the MOS transistor 112. As a result, the same or similar advantage as/to in FIG. 1 may also be achieved in FIG. 2. The replacement of the resistive elements 111 with the MOS transistors 112 may reduce the area, thus leading to reducing the size and manufacturing cost of the circuit.

(Delta-Sigma Modulator)

Figure 3:
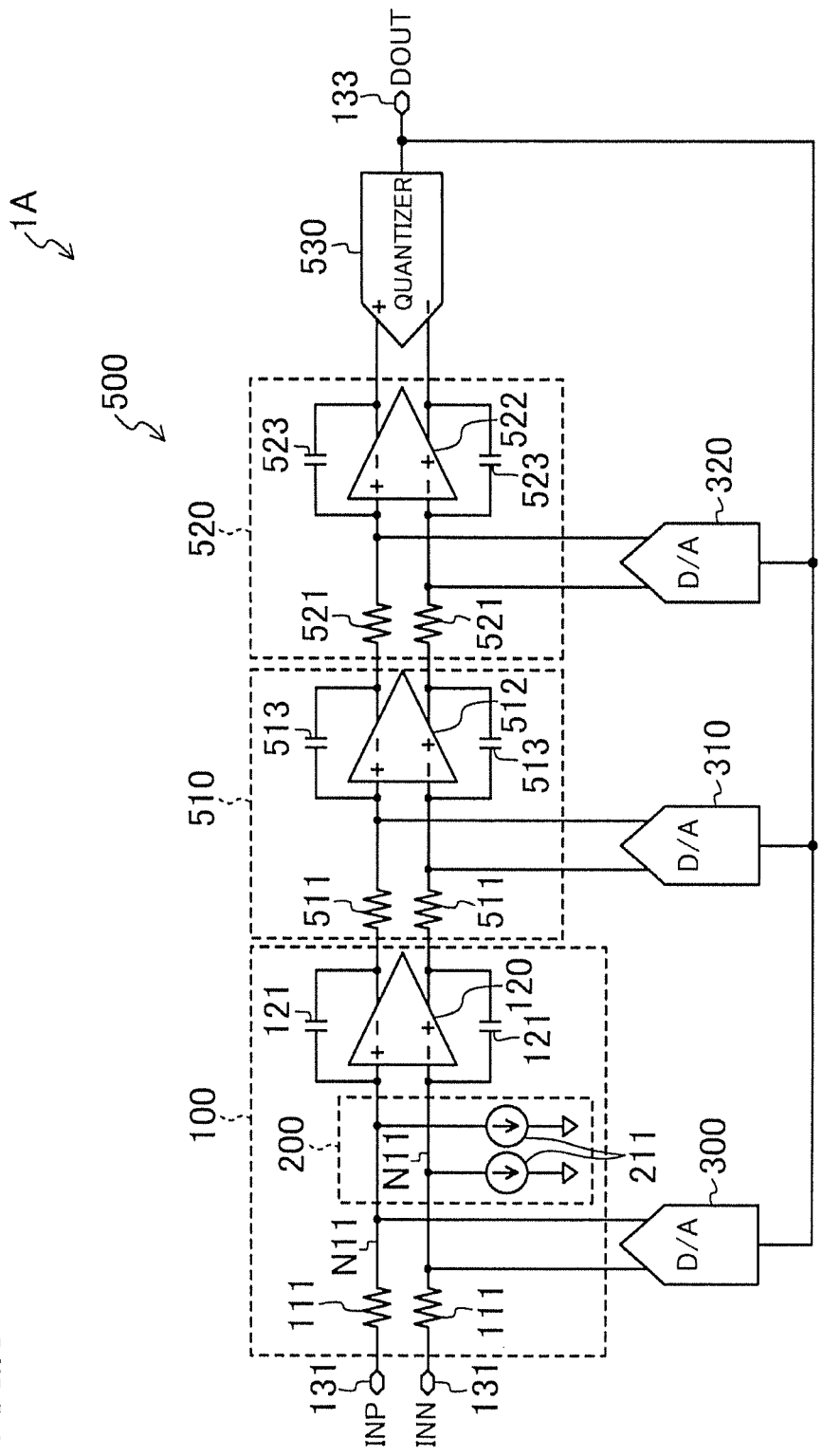
FIG. 3 conceptually illustrates a delta-sigma modulator including an integrator according to the first embodiment.

FIG. 3 conceptually illustrates a delta-sigma modulator 1A including the integrator 100 according to this embodiment.

The delta-sigma modulator 1A includes an analog filter 500, a quantizer 530, and current type D/A converters 300, 310, and 320. The analog filter 500 receives a differential pair of analog input signals INP and INN. The quantizer 530 receives the analog signals that have been output from the analog filter 500, generates digital output signals DOUT, and outputs them to an output terminal 133. The current type D/A converters 300, 310, and 320 perform D/A conversion, i.e., convert the digital signals DOUT that have been output from the quantizer 530 into analog signals, and feed the analog signals back to the analog filter 500. The analog filter 500 includes cascaded integrators 100, 510, and 520, and the input signals INP and INN are supplied to the integrator 100. The integrator 510 includes an operational amplifier 512 and a differential pair of capacitive elements 513. The operational amplifier 512 receives a differential pair of output signals OUTP and OUTN from the integrator 100 via a differential pair of resistive elements 511. Each of the capacitive elements 513 is connected between an associated pair of input and output terminals of the operational amplifier 512. The integrator 520 also includes an operational amplifier 522 and a differential pair of capacitive elements 523. The operational amplifier 522 receives a differential pair of output signals from the integrator 510 via a differential pair of resistive elements 521. Each of the capacitive elements 523 is connected between an associated pair of input and output terminals of the operational amplifier 522.

In the delta-sigma modulator 1A shown in FIG. 3, the integrator 100 according to this embodiment is used as an exemplary initial-stage integrator. That is to say, in the delta-sigma modulator 1A of this embodiment, the voltage regulator circuit 200 may be provided for only the initial-stage integrator 100 receiving the differential pair of external input signals INP and INN. However, this is only an exemplary embodiment. Optionally, the integrator of this embodiment may be applied to not only the integrator 100 but also the other integrators 510 and 520 as well.

Figure 4:
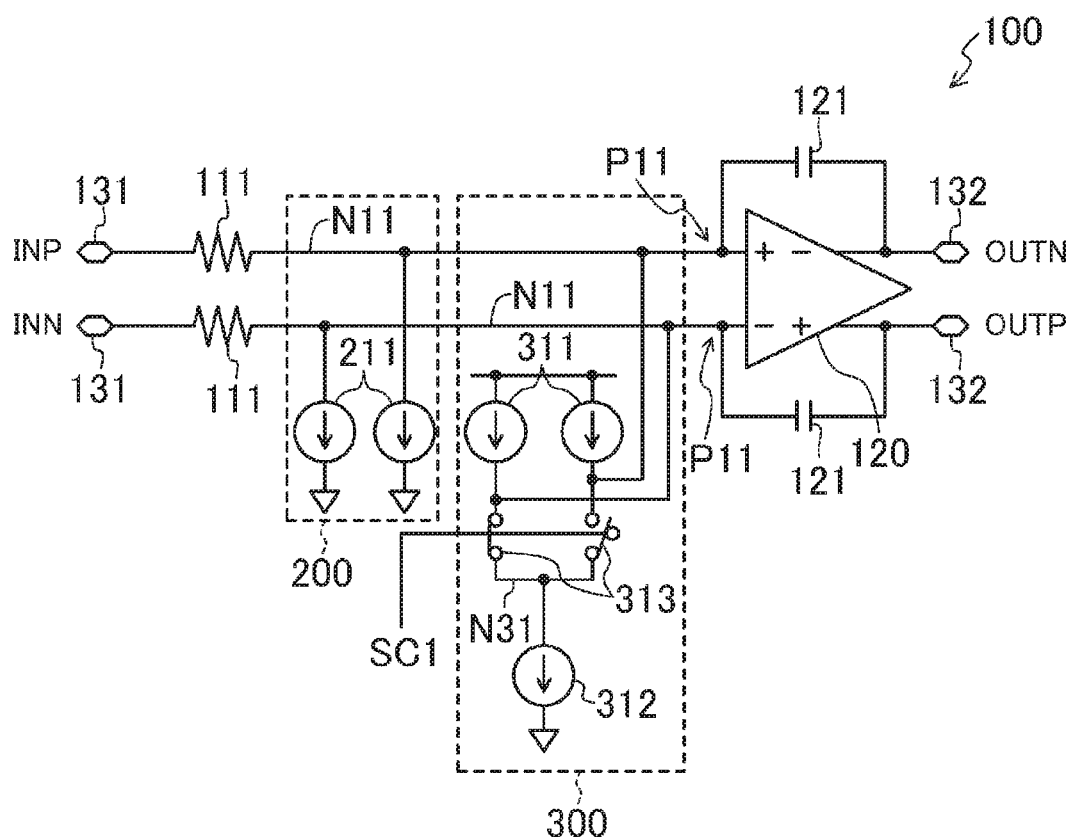
FIG. 4 illustrates an exemplary connection between an integrator and a D/A converter in the delta-sigma modulator of FIG. 3.

FIG. 4 illustrates an example in which a D/A converter 300 is connected to the integrator 100 in the delta-sigma modulator 1A illustrated in FIG. 3. As illustrated in FIG. 4, the D/A converter 300 is connected to the virtual ground points P11 of the integrator 100. Specifically, the D/A converter 300 includes two switches 313, a current source 312, and two current sources 311. The two switches 313 each have one terminal thereof connected to an associated one of the differential pair of intermediate nodes N11 of the integrator 100. The current source 312 is connected between the ground and a node N31 connected to the other terminals of the two switches 313. The two current sources 311 are each connected to an associated one of the differential pair of intermediate nodes N11. Each of the switches 313 turns ON or OFF in response to a control signal SC1. If any of these switches 313 turns ON (and turns electrically conductive), the current source 312 allows a current to flow in such a direction as to extract the current from its associated intermediate node N11. Each of the current sources 311 is configured to supply a smaller amount of current than the current extracted by the current source 312 to its associated intermediate node N11. As a result, each of the current sources 211 of the voltage regulator circuit 200 allows a current to always flow in such a direction as to extract the current from its associated intermediate node N11. The D/A converter 300 allows the current to flow into, and out of, the intermediate node N11.

Next, an exemplary specific situation will be described in detail where, in FIG. 4, the potential at the virtual ground points P11 of the operational amplifier 120 of the integrator 100 is 1 V, the resistance value of the resistive elements 111 is 1 kΩ and a differential pair of analog signals of 2 V±0.5 V are input as the input signals INP and INN. In this case, the current sources 211 of the voltage regulator circuit 200 are set to allow a current of 1000 μA to flow in such a direction as to extract the current from the intermediate nodes N11, for example. In this case, for example, the current sources 311 are set to allow a current of 500 μA to flow in such a direction as to supply the current to the intermediate nodes N11, whereas the current source 312 is set to allow a current of 1000 μA to flow in such a direction as to extract the current from the intermediate nodes N11. Thus, the D/A converter 300 allows currents of ±500 μA to flow into, and out of, the intermediate nodes N11, for example. With such a configuration, even if the center voltage (2 V) of each of the input signals INP and INN is different from the voltage (1 V) at the virtual ground points P11, part of direct current flowing into the intermediate nodes N11 from the resistive elements 111 due to the voltage difference flows into the current sources 211 of the voltage regulator circuit 200. On the other hand, the integrator 100 may calculate the integral of the current change if the input amplitude changes.

As can be seen, according to this embodiment, the delta-sigma modulator 1A including the integrator 100 comprised of core transistors having a low breakdown voltage may increase the magnitude of the voltage drop across the resistive elements 111, i.e., may shift the center voltage of each of the input signals INP and INN. Thus, a signal having larger amplitude than the supply voltage of the core transistors may be input, thus improving the SNR of the delta-sigma modulator 1A. That is to say, this embodiment may provide a delta-sigma modulator with improved precision.

Note that the numerical values adopted in the specific example described above, including the value (1.5 V) of the supply voltage VDD2 of the core transistors, the center voltage (2 V) of each of the input signals INP and INN, the signal amplitude (±0.5 V) of each of the input signals INP and INN, and the current value of each of the current sources 211, 311, and 312, are exemplary values set for convenience sake to allow the reader to easily understand the present disclosure. These values may vary as appropriate depending on the system to which the integrator 100 and the delta-sigma modulator 1A are applied. In the following embodiments, the respective settings such as the supply voltage and other values are also merely examples adopted for convenience sake, and are not intended to limit the present disclosure, or the scope of application or use of the disclosure.

Figure 5:
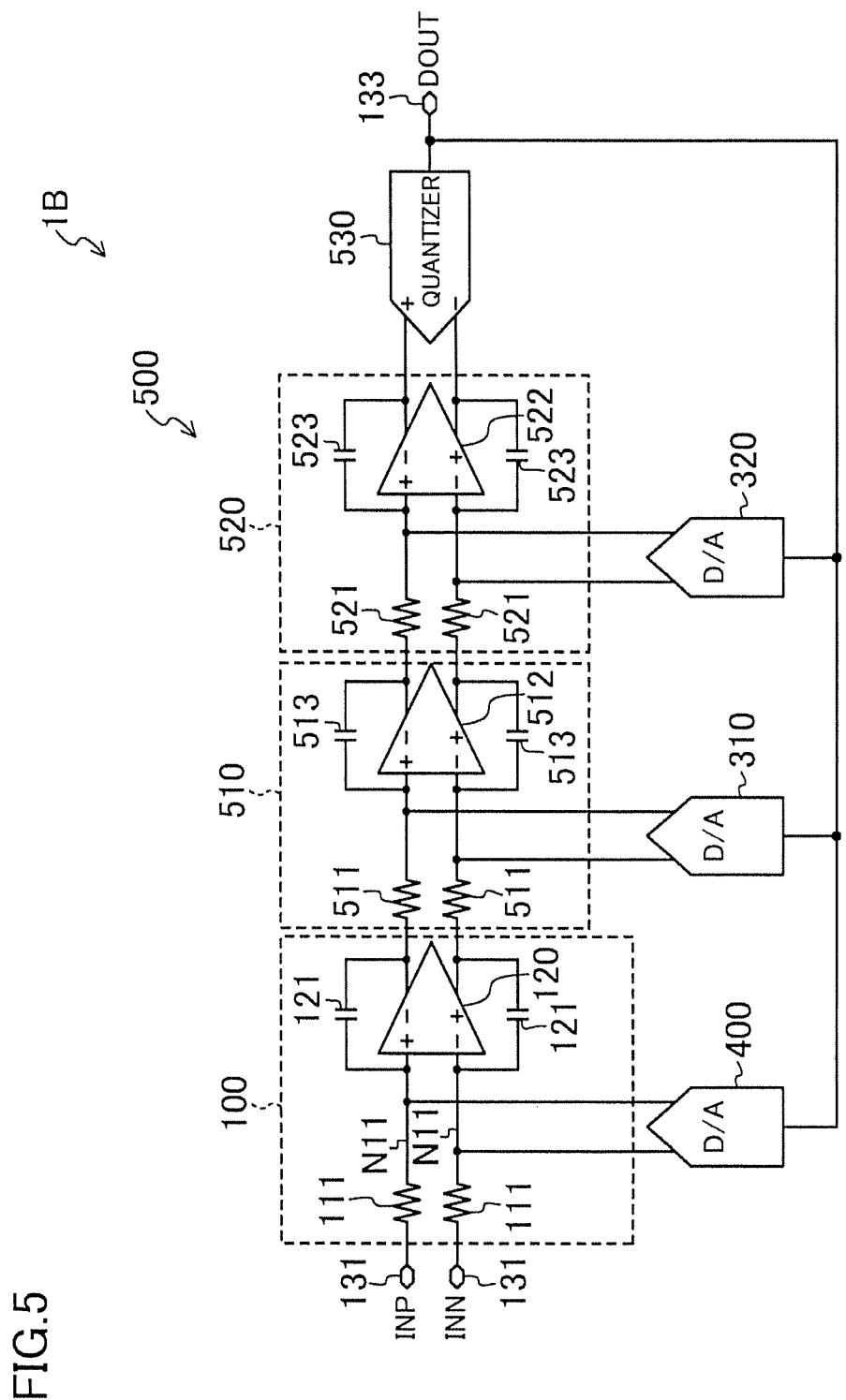
FIG. 5 illustrates an exemplary variation of the delta-sigma modulator.

In FIGS. 3 and 4, the voltage regulator circuit 200 of the integrator 100 may be integrated with the D/A converter 300. FIG. 5 illustrates an exemplary delta-sigma modulator 1B in which the voltage regulator circuit 200 and the D/A converter 300 of the integrator 100 are integrated together.

The delta-sigma modulator 1B illustrated in FIG. 5 is obtained by omitting the voltage regulator circuit 200 from the integrator 100 of FIG. 3. The delta-sigma modulator 1B includes, instead of the D/A converter 300, a D/A converter 400 with a function of regulating a voltage (hereinafter simply referred to as "the D/A converter 400").

Figure 6:
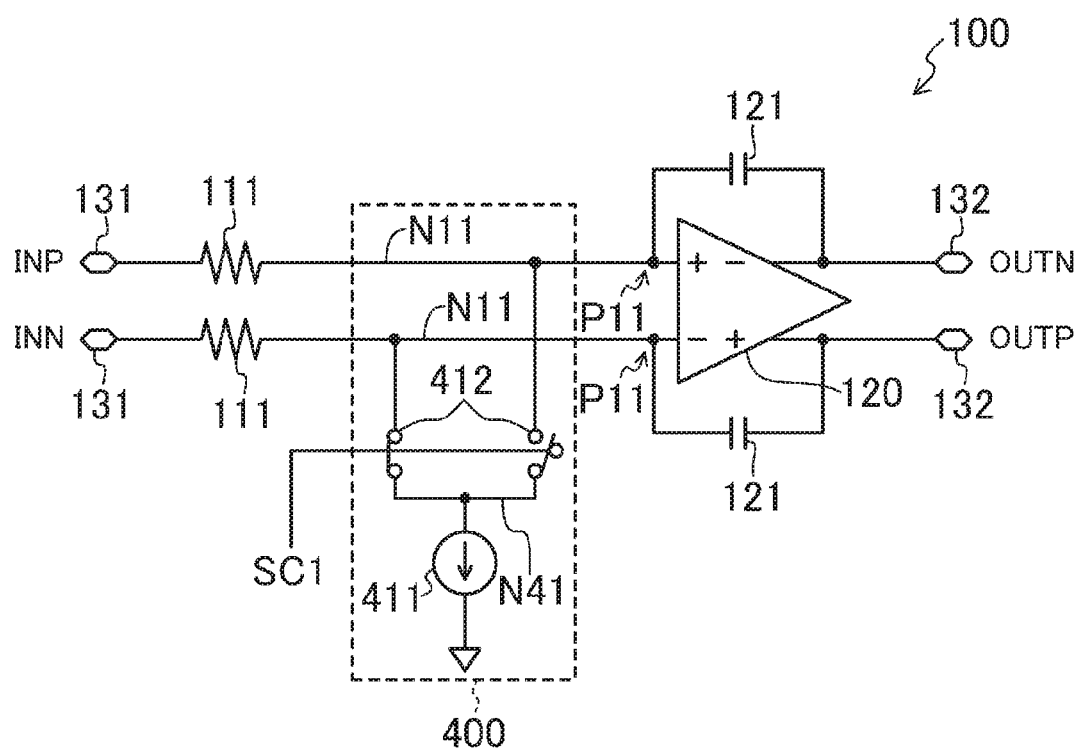
FIG. 6 illustrates an exemplary connection between an integrator and a D/A converter in the delta-sigma modulator of FIG. 5.

FIG. 6 illustrates an example in which the D/A converter 400 is connected to the integrator 100 in the delta-sigma modulator 1B illustrated in FIG. 5. As illustrated in FIG. 6, in this delta-sigma modulator 1B, the D/A converter 400 is connected to the virtual ground points P11 of the integrator 100. Specifically, the D/A converter 400 includes two switches 412, and a current source 411. The two switches 412 each have one terminal thereof connected to an associated one of the differential pair of intermediate nodes N11 of the integrator 100. The current source 411 is connected between the ground and a node N41 connected to the other terminals of the two switches 412, and functions as a first current source. Each of the switches 412 turns ON or OFF in response to a control signal SC1. If the switch 412 turns ON (and turns electrically conductive), the current source 411 allows a current to flow in such a direction as to extract the current from the intermediate nodes N11.

Next, an exemplary specific situation will be described in detail where, in FIG. 6, the potential at the virtual ground points P11 of the operational amplifier 120 of the integrator 100 is 1 V, the resistance value of the resistive elements 111 is 1 kΩ and a differential pair of analog signals of 2 V±0.5 V are input as the input signals INP and INN. In that case, for example, the current source 411 of the voltage regulator circuit 400 is set to allow a current of 2000 μA to flow in such a direction as to extract the current from the intermediate node N11. Thus, depending on whether the switches 412 turn ON or OFF, the D/A converter 400 switches between a state where a current flows into or out of the intermediate nodes N11, i.e., a state where a current of 2000 μA is extracted from the intermediate nodes N11 and a state where no current flows into or out of the intermediate nodes N11 during a D/A conversion operation. As can be seen, the current of the current source 411 of the D/A converter 400 includes an offset current to increase a voltage drop across the resistive element 111. Thus, even if the center voltage (2 V) of each of the input signals INP and INN is different from the voltage (1 V) at the virtual ground points P11, part of direct current flowing into the intermediate nodes N11 from the resistive elements 111 due to the voltage difference flows into the current source 411 of the voltage regulator circuit 400. On the other hand, the integrator 100 may calculate the integral of the variation in current if the input amplitude changes. In the configurations of FIGS. 5 and 6, if the switches 412 of the D/A converter 400 are not ON, no current can be extracted from the intermediate nodes N11. However, in that case, no problem occurs as long as the switch 412 may switch quickly enough with respect to the frequencies of the input signals INP and INN. In particular, the delta-sigma modulator is of oversampling type, and is suitable for the configurations of FIGS. 5 and 6.

With such configurations, it is not necessary to provide the D/A converter and the voltage regulator circuit separately. This may reduce the number of elements that form the delta-sigma modulator.

In FIG. 6, the D/A converter 400 may further include two current sources 413 (not illustrated) each configured to supply a smaller amount of current than that of the current source 411 to an associated one of the differential pair of intermediate nodes N11. At that time, the current values of the current sources 411 and 413 are set such that part of direct current flowing into the intermediate nodes N11 due to the voltage difference between the center voltage of each of the input signals INP and INN and the voltage at the virtual ground points P11 flows into the ground through the D/A converter 400. That is to say, the currents of the current sources 411 and 413 are set to flow into, and out of, the intermediate node during the D/A conversion, and include an offset current to increase the voltage drop across the resistive element 111. As a result, the same or similar advantage may also be achieved as/to in FIG. 6.

Second Embodiment

Operational Principle of Feedforward Delta-Sigma Modulator

Figure 12:
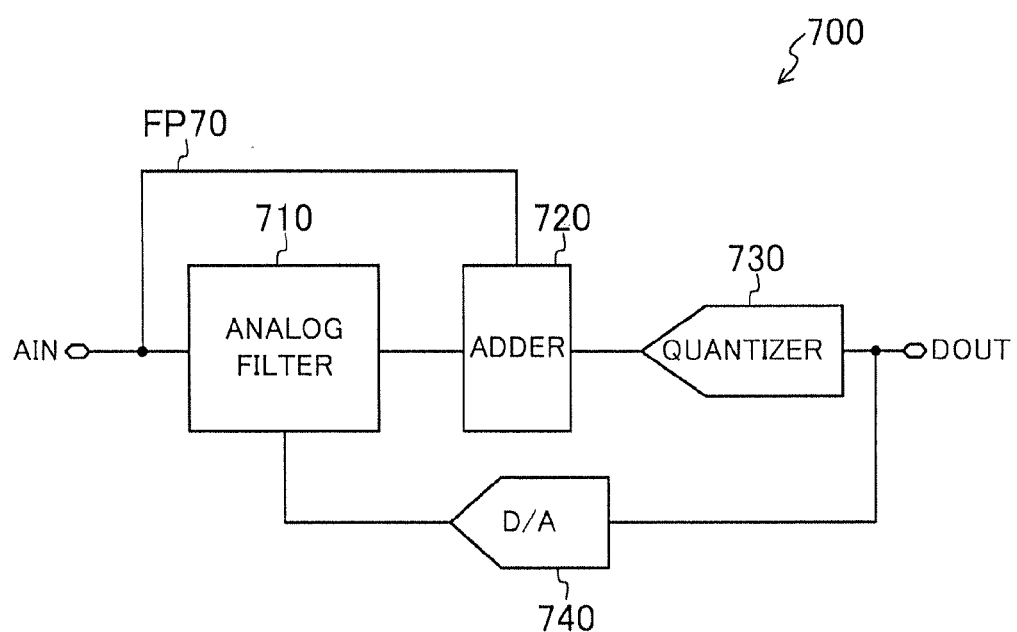
FIG. 12 conceptually illustrates a typical delta-sigma modulator of feedforward type.

A delta-sigma modulator of a feedforward type is a widely used modulator, and its configuration is suitable when an operational amplifier driven with a low supply voltage is used. FIG. 12 illustrates a typical feedforward delta-sigma modulator 700.

The delta-sigma modulator 700 includes an analog filter 710, a signal adder circuit 720, a quantizer 730, and a current-type D/A converter 740. The analog filter 710 receives an analog input signal AIN. The signal adder circuit 720 adds the output signal of the analog filter 710 to an input signal AIN that the signal adder circuit 720 has received through a feedforward node FP70. The quantizer 730 receives the analog signal that has been output from the signal adder circuit 720 and generates and outputs a digital output signal DOUT. The current-type D/A converter 740 receives the digital output signal DOUT from the quantizer 730 and feeds that signal as an analog signal back to the analog filter 710.

Figure 13A:
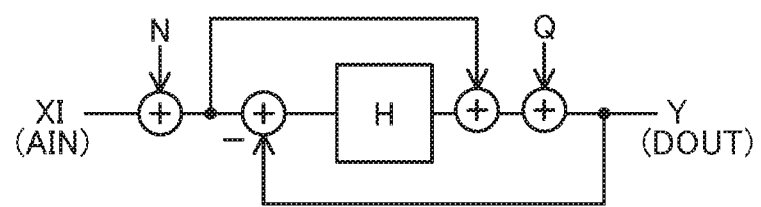
FIGS. 13A and 13B illustrate the typical delta-sigma modulator of FIG. 12 using a transfer function.
Figure 13B:
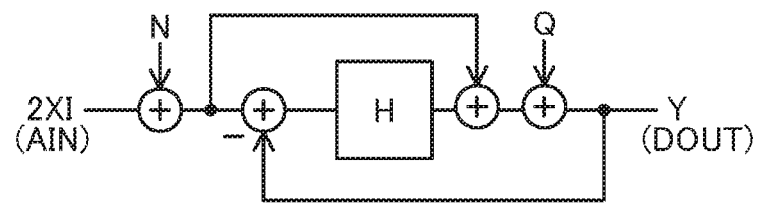

FIGS. 13A and 13B are block diagrams of the typical feedforward delta-sigma modulator 700 illustrated in FIG. 12. FIG. 13A is a block diagram illustrating a situation where a signal XI with amplitude that can be processed by a core transistor is input as an input signal AIN. Its transfer function is expressed by the following Mathematical Formula (1).

[Mathematical Formula (1)]

$$Y = XI + N + Q\frac{1}{1+H} \quad (1)$$

As expressed in Mathematical Formula (1), in the delta-sigma modulator 700 illustrated in FIG. 12, only the quantization noise is subjected to a filter of 1/(1+H), and noise is shaped. In the block diagram of FIG. 13 and Mathematical Formula (1), N is noise the input signal XI receives, H is a transfer characteristic of the analog filter 710, Q is the quantization noise of the quantizer 730, and Y is the digital output signal DOUT.

FIG. 13B is a block diagram illustrating a situation where the amplitude of the input signal AIN is doubled (as indicated by "2XI" in FIG. 13B) in order to improve the SNR of the delta-sigma modulator 700, and its transfer function is expressed by the following Mathematical Formula (2). Here, the amplitude of the signal 2XI is supposed to exceed the range of the amplitude that can be processed by the core transistor.

[Mathematical Formula (2)]

$$Y = 2XI + N + Q\frac{1}{1+H} \quad (2)$$

As shown in Mathematical Formula (2), only the signal component of the transfer function of Mathematical Formula (2) is twice that of Mathematical Formula (1). Thus, the SNR of the delta-sigma modulator 700 is improved. However, in the feedforward delta-sigma modulator 700, if the amplitude of the input signal AIN is doubled, this input signal AIN with larger amplitude is input not only to the analog filter 710 but also to the signal adder circuit 720. The signal adder circuit 720 and the quantizer 730 that receives the output signal of the signal adder circuit 720 are each configured as a set of core transistors. Thus, they cannot process a signal with such large amplitude, and the circuit cannot operate normally. Therefore, some countermeasures need to be taken.

(Delta-Sigma Modulator)

Figure 7:
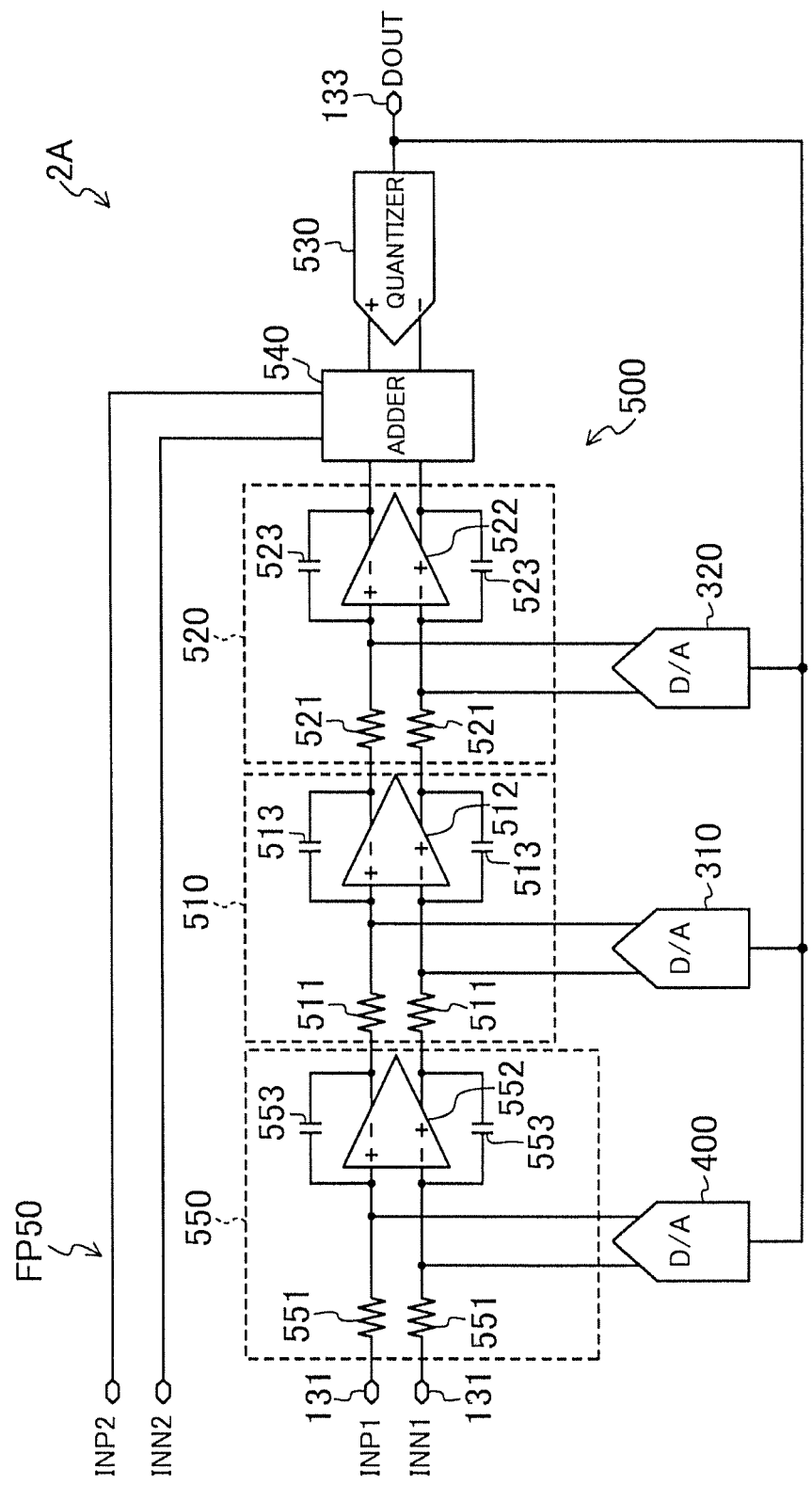
FIG. 7 conceptually illustrates a delta-sigma modulator according to a second embodiment.

FIG. 7 conceptually illustrates a delta-sigma modulator 2A according to a second embodiment.

In FIG. 7, it is supposed that analog input signals INP1 and INN1 are input signals with large amplitude (for example, amplitude that exceeds the range of the supply voltage VDD1 of the core transistor), and feedforward signals INP2 and INN2 are input signals obtained by, e.g., attenuating the amplitude of each of input signals INP1 and INN1 to such a level that can be processed by the core transistors. Such feedforward signals INP2 and INN2 are not limited to the signals obtained by attenuating the amplitude of the input signals INP1 and INN1, but just need to have smaller amplitude than the input signals INP1 and INN1. For example, the feedforward signals INP2 and INN2 may have such amplitude that can be processed by the core transistors.

The delta-sigma modulator 2A includes an analog filter 500, a signal adder circuit (adder) 540, a quantizer 530, and current-type D/A converters 400, 310, and 320. The analog filter 500 receives analog input signals INP1 and INN1 (first input signals). The signal adder circuit 540 adds the analog signals that have been output from the analog filter 500 and feedforward signals INP2 and INN2 (second input signals) that have been supplied through a feedforward node FP50. The quantizer 530 receives the analog signals that have been output from the signal adder circuit 540, generates a digital output signal DOUT and output the digital output signal DOUT to an output terminal 133. The current-type D/A converters 400, 310, and 320 are configured to perform D/A conversion, i.e., convert the digital output signal DOUT supplied from the quantizer 530 into analog signals to feed those analog signals back to the analog filter 500. The analog filter 500 includes cascaded integrators 550, 510, and 520, and the input signals INP1 and INN1 are supplied to the integrator 550. The integrator 550 includes an operational amplifier 552 and a differential pair of capacitive elements 553. The operational amplifier 552 receives the input signals INP1 and INN1 through a differential pair of resistive elements 551. The capacitive elements 553 are each connected between associated input and output terminals of the operational amplifier 552. The output terminals of the integrator 550 are connected to the resistive elements 511 of the integrator 510.

The D/A converter 400 of the delta-sigma modulator 2A is a D/A converter with the same or similar voltage regulating function as/to the D/A converter 400 of FIG. 6, and will be hereinafter simply referred to as the D/A converter 400.

Figure 8:
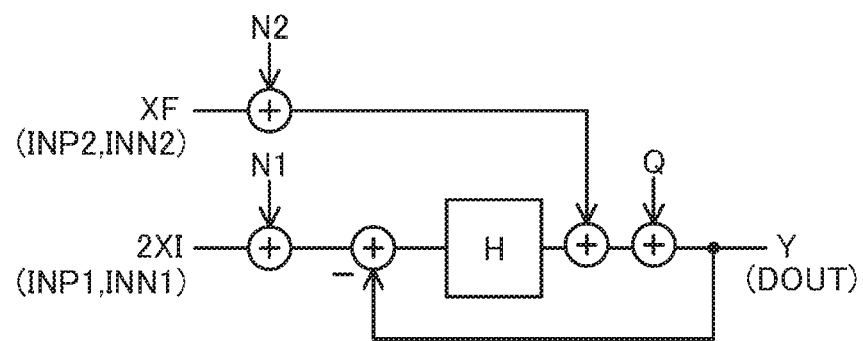
FIG. 8 illustrates a delta-sigma modulator according to the second embodiment using a transfer function.

FIG. 8 is a block diagram of the feedforward delta-sigma modulator 2A illustrated in FIG. 7, and its transfer function is expressed by the following Mathematical Formula (3). In FIG. 8, the signals 2XI with amplitude that exceeds the range of the voltage that can be processed by the core transistors are supposed to be given as the input signals INP1 and INN1 as in FIG. 13B. Also, the signals XI with such amplitude that can be processed by the core transistors are supposed to be given as the feedforward signals INP2 and INN2.

[Mathematical Formula (3)]

$$Y = 2XI + N1\frac{H}{1+H} + N2\frac{1}{1+H} + Q\frac{1}{1+H} \quad (3)$$

In the block diagram of FIG. 8 and Mathematical Formula (3), N1 is noise received by the input signals 2XI given to the analog filter 500 as the input signals INP1 and INN1, N2 is noise received by the input signals XI given to the signal adder circuit 540 as feedforward signals INP2 and INN2, H is a transfer characteristic of the analog filter 500, Q is quantization noise of the quantizer 530, and Y is the digital output signal DOUT.

In Mathematical Formula (3), if the noise N1 and the noise N2 are both supposed to be N, Mathematical Formula (3) may be expressed by the following Mathematical Formula (4):

[Mathematical Formula (4)]

$$Y = 2XI + N + Q\frac{1}{1+H} \quad (4)$$

Mathematical Formula (4) are the same as Mathematical Formula (2). That is to say, the transfer function of the delta-sigma modulator 2A according to this embodiment is the same as, or similar to, the transfer function obtained when the amplitude of the input signal AIN of the typical feedforward delta-sigma modulator 700 is doubled, and the same or similar advantage may be achieved. Furthermore, the signal adder circuit 540 is supplied with the feedforward signals INP2 and INN2 with such amplitude that can be processed by the core transistor. Thus, the circuits such as the signal adder circuit 540, and the quantizer 530 may be operated normally, and the delta-sigma modulator 2A may be operated normally as well.

As can be seen, this embodiment may provide a feedforward delta-sigma modulator with improved precision.

In this embodiment, the analog filter 500 and the D/A converter 400 that are the same as those in FIGS. 5 and 6 are supposed to be adopted. However, this is only an example. Alternatively, the analog filter 500 (the integrator 100 in FIG. 1) and the D/A converter 300 that are illustrated in FIG. 3 may also be adopted. If the analog filter 500 and the D/A converter 300 in FIG. 3 are adopted, the initial-stage integrator 100 may include no voltage regulator circuits. That is to say, the analog filter 500 may process input signals INP1 and INN1 with large amplitude without using any voltage regulator circuit.

(Exemplary Application)

Figure 9:
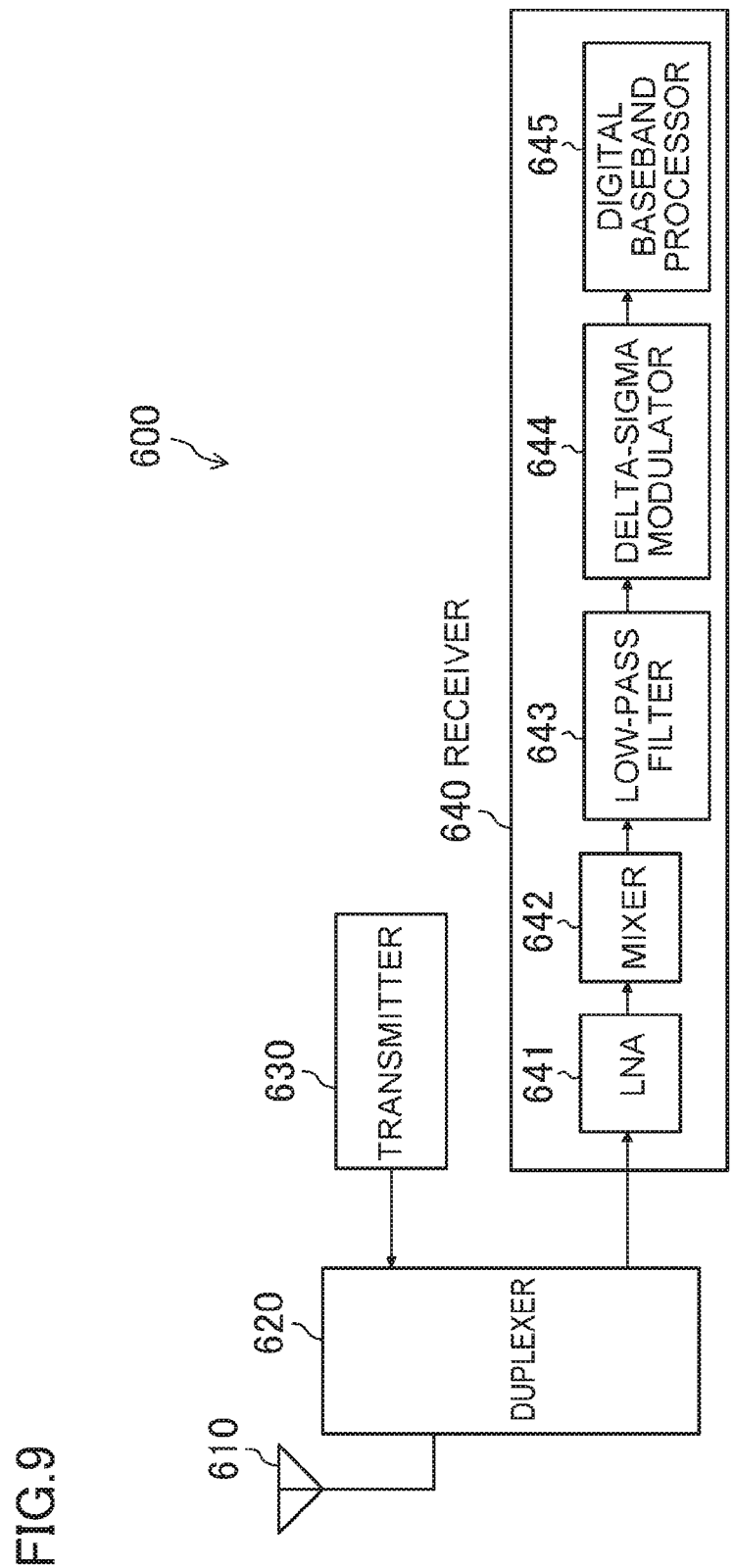
FIG. 9 illustrates a wireless communications device as an exemplary application of the present disclosure.

FIG. 9 is a block diagram illustrating an exemplary configuration for a wireless communications device including the integrator and delta-sigma modulator according to the first and second embodiments.

A communications device 600 of FIG. 9 includes: an antenna 610 at/from which a radio wave is received/transmitted; a transmitter 630 configured to perform predetermined transmission processing including modulation processing on a signal to be transmitted; a receiver 640 configured to perform predetermined reception processing including decoding processing on a received signal; and a duplexer 620 configured to perform switching between the signal to be transmitted and the received signal.

The receiver 640 includes a low noise amplifier (LNA) 641, a mixer 642, a low-pass filter 643, a delta-sigma modulator 644 according to the first or second embodiment (e.g., the delta-sigma modulator 1A illustrated in FIG. 3), and a digital baseband processor 645.

Use of such a configuration may provide a wireless communications device that maintains high precision with respect to broadband signals. Thus, application of such a configuration to, e.g., cellphones or any other mobile telecommunications devices may achieve high transmitting and receiving speech quality while reducing the power consumption and the circuit area of the device.

The above-described delta-sigma modulator 644 (for example, the delta-sigma modulator 1A of FIG. 3) may also be used in a receiving device. Such a receiving device includes all of the elements illustrated in FIG. 9 but the duplexer 620 and the transmitter 630, for example. That is to say, in that case, the receiver includes the antenna 610 and the receiver 640. The signal that has been received at the antenna 610 is input to the LNA 641 of the receiver 640.

The present disclosure may improve precision of an integrator, and such an integrator is thus useful for delta-sigma modulators and data converter circuits. This integrator is also useful for receiver circuits for use in various communications devices including these circuits such as wireless communications devices (e.g., cellphones and millimeter wave sensors), base stations, and tuners. This integrator is also useful for various electric devices including these circuits such as audio devices, video devices, and medical electronic devices.

What is claimed is:

1. An integrator comprising:
    a resistive element connected to an input terminal;
    an operational amplifier configured to receive, through the resistive element, an input signal supplied to the input terminal; and
    a voltage regulator circuit connected to an intermediate node between the resistive element and the operational amplifier, wherein
    the voltage regulator circuit has a first current source connected to the intermediate node, and a switch connected between the intermediate node and the first current source and selectively turning ON or OFF.

2. The integrator of claim 1, wherein
    the resistive element is a transistor.

3. A delta-sigma modulator comprising:
    the integrator of claim 1;
    a quantizer configured to convert an output signal of the integrator into a digital signal; and
    a D/A converter configured to convert the digital signal into an analog signal and feed the analog signal back to the intermediate node of the integrator.

4. A communications device including the delta-sigma modulator of claim 3.

5. The delta-sigma modulator of claim 3, wherein
    the D/A converter performs not only its own D/A conversion function but also the function of the voltage regulator circuit as well, and is configured to allow a current to flow into, and out of, the intermediate node while performing the D/A conversion, and a current value of the current allowed to flow into, and out of, the intermediate node includes an offset current to increase the voltage drop across the resistive element.

6. A delta-sigma modulator comprising:
an integrator including:
a resistive element connected to an input terminal;
an operational amplifier configured to receive, through the resistive element, an input signal supplied to the input terminal; and
a voltage regulator circuit connected to an intermediate node between the resistive element and the operational amplifier, the voltage regulator circuit having a first current source connected to the intermediate node;
a quantizer configured to convert an output signal of the integrator into a digital signal; and
a D/A converter configured to convert the digital signal into an analog signal and feed the analog signal back to the intermediate node of the integrator.

7. The delta-sigma modulator of claim 6, wherein
the D/A converter performs not only its own D/A conversion function but also the function of the voltage regulator circuit as well, and is configured to allow a current to flow into, and out of, the intermediate node while performing the D/A conversion, and
a current value of the current allowed to flow into, and out of the intermediate node includes an offset current to increase the voltage drop across the resistive element.

8. A communications device including the delta-sigma modulator of claim 6.

9. The delta-sigma modulator of claim 6 further comprising:
an adder connected between the operational amplifier and the quantizer.

10. The delta-sigma modulator of claim 9 further comprising:
a second input terminal,
wherein the adder adds a second input signal supplied to the second input terminal to an output signal of the integrator and supplies an output signal to the quantizer.

11. The delta-sigma modulator of claim 9, wherein the second input signal has a smaller amplitude than the first input signal supplied to the input terminal.

12. A communications device including the delta-sigma modulator of claim 9.

* * * * *